United States Patent
Haidinyak

(10) Patent No.: US 6,982,136 B1
(45) Date of Patent: Jan. 3, 2006

(54) METHOD AND SYSTEM FOR DETERMINING OPTIMUM OPTICAL PROXIMITY CORRECTIONS WITHIN A PHOTOLITHOGRAPHY SYSTEM

(75) Inventor: Chris Haidinyak, Santa Cruz, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/966,854

(22) Filed: Oct. 15, 2004

Related U.S. Application Data

(62) Division of application No. 10/161,450, filed on May 31, 2002, now Pat. No. 6,824,937.

(51) Int. Cl.
*G03F 9/00* (2006.01)
*G06F 17/50* (2006.01)

(52) U.S. Cl. ............... 430/5; 382/144; 716/19; 716/20; 716/21

(58) Field of Classification Search ............ 430/5; 382/144; 716/19, 20, 21
See application file for complete search history.

(56) References Cited

U.S. PATENT DOCUMENTS 5,994,009 A * 11/1999 Tzu et al. ............ 430/30
6,243,855 B1 * 6/2001 Kobayashi et al. ........ 716/19

* cited by examiner

*Primary Examiner*—Christopher G. Young
(74) *Attorney, Agent, or Firm*—Monica H. Choi

(57) ABSTRACT

For determining optimum optical proximity corrections (OPCs) for a mask pattern, mask areas are formed on a reticle with each mask area having the mask pattern of polygons that are modified with respective OPCs perturbations. A respective patterned area is fabricated on a semiconductor wafer from each mask area of the reticle. A respective microscopy image of each respective patterned area is generated to determine a respective error function for each mask area by comparing a desired image of the mask pattern and the respective microscopy image. The optimum OPCs are determined as the respective OPCs perturbations corresponding to one of the mask areas having the respective error function that is a minimum of the mask areas.

12 Claims, 9 Drawing Sheets

METHOD AND SYSTEM FOR DETERMINING OPTIMUM OPTICAL PROXIMITY CORRECTIONS WITHIN A PHOTOLITHOGRAPHY SYSTEM

This is a divisional of an earlier filed copending patent application, with Ser. No. 10/161,450 filed on May 31, 2002, now U.S. Pat. No. 6,824,937, for which priority is claimed. This earlier filed copending patent application with Ser. No. 10/161,450 is in its entirety incorporated herewith by reference.

TECHNICAL FIELD

The present invention relates generally to fabrication of integrated circuits, and more particularly, to a method and system for determining optimum optical proximity corrections for a mask pattern within a photolithography system.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Referring to FIG. 1, a photolithograpy system 100 is used for patterning integrated circuit structures on a semiconductor wafer 102. In the photolithography system 100, a reticle 104 has a pattern of polygons thereon to be patterned onto the semiconductor wafer 102. Light from a light source 106 is illuminated through the pattern of polygons on the reticle 104 onto the semiconductor wafer 102. In addition, a lens system 108 is used within the photolithography system 100 to typically reduce the image of the pattern of polygons on the reticle 104 onto the semiconductor wafer 102. The pattern of polygons on the reticle 104 are typically opaque to the light from the light source 106.

A photoresist material on the semiconductor wafer 102 is cured when light from the light source 106 reaches the photoresist material and is not cured otherwise. When the photoresist material is then developed, cured photoresist material may be etched away while the uncured photoresist material remains, and the remaining uncured photoresist material may further act as a mask for etching away exposed material deposited below the photoresist material. Thus, when the light from the light source 106 does not reach the semiconductor wafer 102 for the pattern of opaque polygons on the reticle 104, the pattern of polygons on the reticle 104 is transferred to the photoresist material on the semiconductor wafer 102. Such a photolithography system 100 is known to one of ordinary skill in the art of integrated circuit fabrication.

As the dimensions of integrated circuit structures are constantly scaled down such that a desired dimension of an integrated circuit structure is smaller than the wavelength of the light from the light source 106 within the photolithography system 100, the shape and dimensions of the structure formed on the semiconductor wafer 102 is no longer that expected from the design of the pattern of polygons on the reticle 104. For example, referring to FIG. 2, assume that a polygon 110 is designed on the reticle 104 for a rectangular shape to be patterned on the semiconductor wafer 102 within the photolithography system 100. When the width of the polygon 110 is smaller than the wavelength of the light from the light source 106 within the photolithography system 100, the actual polygon 112 patterned onto the semiconductor wafer 102 is different from the expected polygon 110.

Typically, the polygon 110 on the reticle 104 acts as a low-pass filter when the width of the polygon 110 is smaller than the wavelength of the light from the light source 106 such that the corners of the actual polygon 112 become more rounded than desired and the length of the actual polygon 112 become shorter than desired, as known to one of ordinary skill in the art of integrated circuit fabrication. Such non-linear distortions of the actual polygon 112 results from optical diffraction of the light from the light source 106 and resist effects in pattern transfer when the width of the polygon 110 is smaller than the wavelength of the light from the light source 106, as known to one of ordinary skill in the art of integrated circuit fabrication. The nature of the non-linear distortions of the actual polygon 112 also depends on the density, size, and location of nearby polygon features, as known to one of ordinary skill in the art of integrated circuit fabrication.

The wavelength of light from the light source 106 is currently approximately 250 nanometers. However, device dimensions are now desired to be below 200 nanometers. Referring to FIG. 3, to over-come such non-linear distortions, the patterned polygons of the reticle are perturbed with addition of OPC (optical proximity corrections), as known to one of ordinary skill in the art of integrated circuit fabrication. In the example of FIG. 3, such OPC (optical proximity corrections) includes structures that are added to the pattern of polygons of the reticle to negate the non-linear distortions.

Referring to FIG. 3, assume that the initial reticle 104 without any OPC (optical proximity corrections) includes a first polygon 122 and a second polygon 124. Then, OPC (optical proximity corrections) structures are added as perturbations to the polygons 122 and 124 of the initial reticle 104 to result in a perturbed reticle 130. Example OPC (optical proximity corrections) structures include "dog-ears" 132 (i.e., opaque squares or rectangles) added to outside corners of the polygons, "cut-outs" 134 (i.e., transparent squares or rectangles) added to inside corners of the polygons, and long-line embellishments 136 (i.e., transparent rectangles) added to sides of relatively long polygons. When the perturbed reticle 130 is used within the photolithograpy system 100, such OPC (optical proximity corrections) structural perturbations added to the polygons 122 and 124 negate the non-linear distortions such that the pattern transferred to the semiconductor wafer 102 is closer to the desired pattern of polygons even when the dimensions of the polygons are smaller than the wavelength of light from the light source 106, as known to one of ordinary skill in the art of integrated circuit fabrication.

However, different OPC (optical proximity corrections) have different effects on the polygons patterned onto the semiconductor wafer. For example, different shapes, sizes, and locations of the OPC (optical proximity corrections) structures added to perturb the polygons of the reticle have different effects on the polygons patterned onto the semiconductor wafer. Thus, a determination of optimum OPC (optical proximity corrections) is desired for achieving polygons patterned onto the semiconductor wafer that are closest to the desired pattern of polygons.

In the prior art, the optimum OPC (optical proximity corrections) are determined by manual trial and error. Various reticles with different OPC (optical proximity corrections) structures added are used and the resulting polygons patterned onto the semiconductor wafer are visually examined to determine the optimum OPC (optical proximity corrections). However, such a manual determination by trial and error is tedious and prone to human error as such a process is repeated for different integrated circuit processes and different photolithography systems.

Thus, a mechanism is desired for efficiently and accurately determining optimum OPC (optical proximity corrections).

SUMMARY OF THE INVENTION

Accordingly, in a general aspect of the present invention, an array of mask areas are formed on a reticle, and a computer system and a database are used for automatically determining optimum OPC (optical proximity corrections).

In a general aspect of the present invention, in a method and system for determining optimum optical proximity corrections (OPC) for a mask pattern comprised of a plurality of polygons for a photolithography system, an array of a plurality of mask areas are formed on a reticle with each mask area having the mask pattern comprised of the plurality of polygons. The mask pattern comprised of the plurality of polygons is for forming a desired image of the plurality of polygons on a semiconductor wafer within the photolithography system. In addition, the plurality of polygons within each mask area is perturbed with respective optical proximity corrections (OPC) perturbations.

A respective patterned area is fabricated on a semiconductor wafer within the photolithography system from each mask area of the reticle, and each respective patterned area on the semiconductor wafer has a resulting respective plurality of patterned polygons. A respective microscopy image of the respective plurality of patterned polygons formed on each respective patterned area of the semiconductor wafer is generated from a microscopy system and stored within a database. A respective error function for each mask area of the reticle is generated by a computer system from the desired image and the respective microscopy image of the respective patterned area of the semiconductor wafer corresponding to each mask area and is stored within the database. The computer system then determines the optimum optical proximity corrections (OPC) as the respective optical proximity corrections (OPC) perturbations corresponding to a mask area having a respective error function that is a minimum among all of the mask areas.

In this manner, optimum optical proximity corrections (OPC) are efficiently and accurately determined for a pattern of polygons by the use of the array of mask areas on the reticle and the computer system with the database.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, and 10 refer to elements having similar structure and function.

DETAILED DESCRIPTION

According to a general aspect of the present invention, optimum optical proximity corrections (OPC) are determined for an IC (integrated circuit) process and for a photolithography system. The optimum optical proximity corrections (OPC) typically would vary depending on the IC (integrated circuit) process since dimensions and density desired for an IC (integrated circuit) process varies. In addition, the optimum optical proximity corrections (OPC) typically would vary depending on the photolithography system since different components within different photolithography systems would cause different non-linear distortions on the patterned polygons on the semiconductor wafer.

Figure 4:
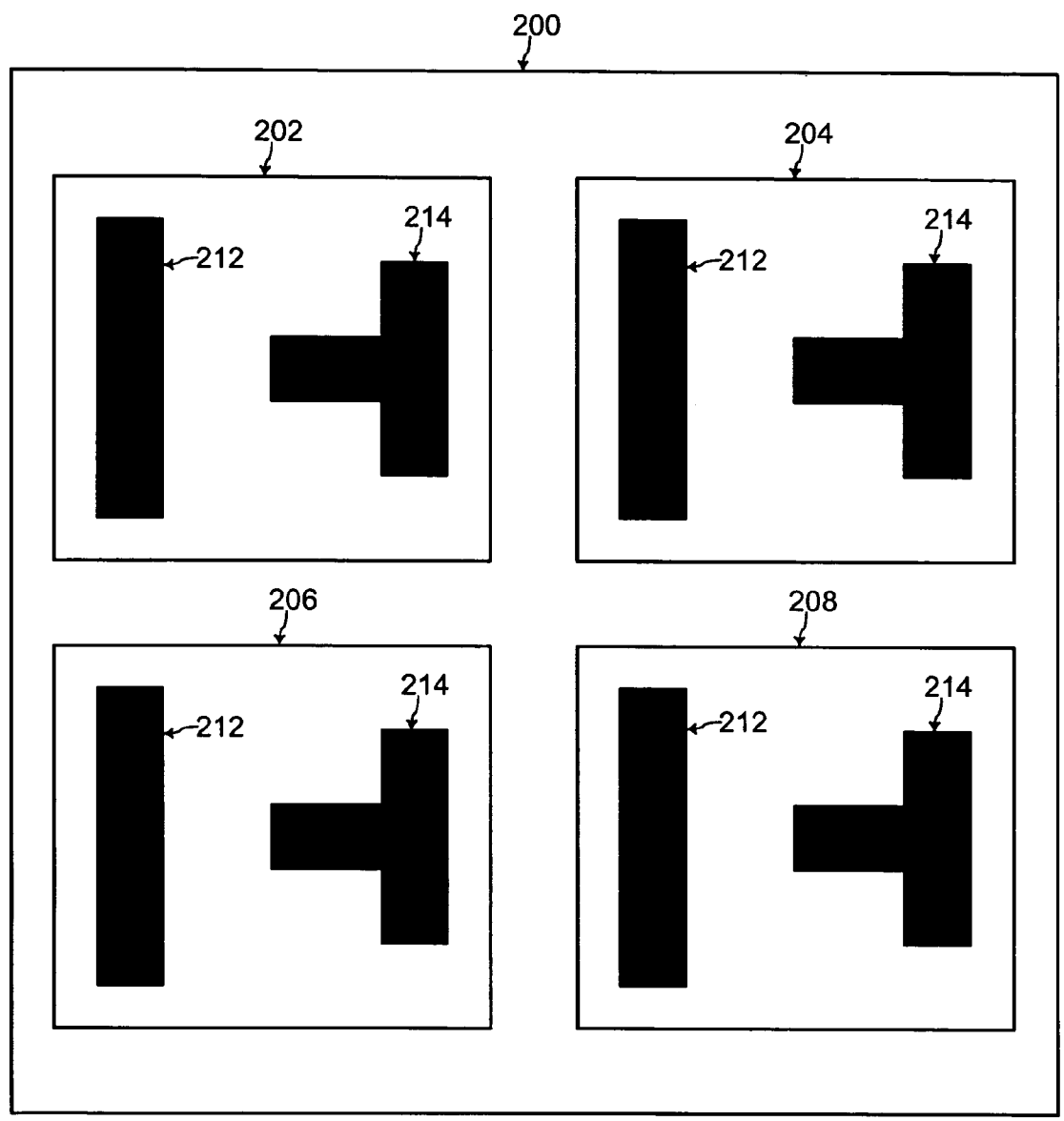
FIG. 4 illustrates an array of mask areas formed on a reticle with each mask area having a same mask pattern comprised of a plurality of polygons, according to an embodiment of the present invention.
Figure 7:
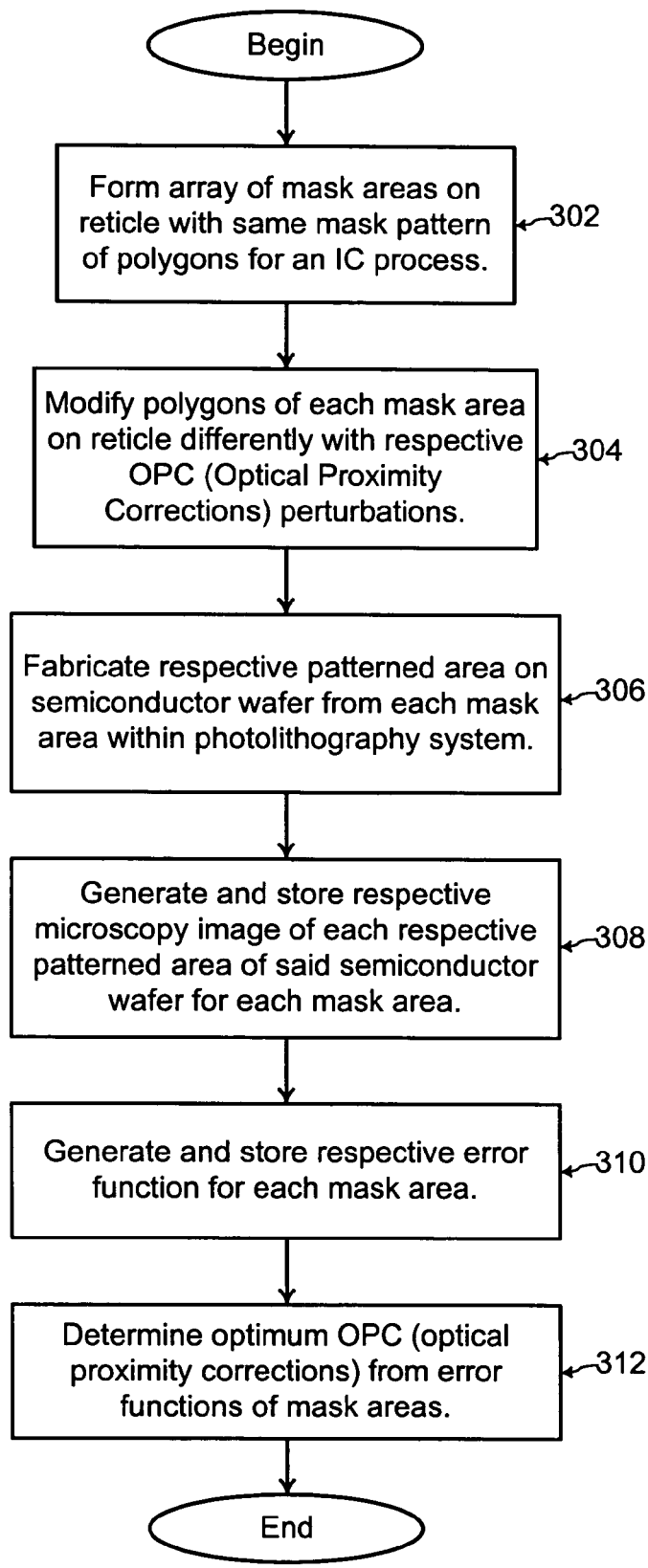
FIG. 7 shows a flowchart of steps of operation of the system of FIG. 6 for automatically determining optimum optical proximity corrections (OPC) from the array of mask areas formed on the reticle of FIG. 5, according to an embodiment of the present invention.

FIG. 7 shows a flow-chart of steps of operation for determining optimum optical proximity corrections (OPC) according to an embodiment of the present invention. Referring to FIG. 4, for determining optimum optical proximity corrections (OPC), an array of mask areas are formed on a reticle 200 including a first mask area 202, a second mask area 204, a third mask area 206, and a fourth mask area 208 (step 302 of FIG. 7). The reticle 200 of the present invention would have a higher number of mask areas such as tens or hundreds of mask areas, but four mask areas 202, 204, 206, and 208 are illustrated in FIG. 4 for clarity of illustration and description.

Each of the mask areas 202, 204, 206, and 208 of the reticle 200 initially has a same mask pattern of a same plurality of polygons including a first polygon 212 and a second polygon 214 (step 302 of FIG. 7). The characteristics of the polygons 212 and 214, such as the shape, the size, location, and density, are determined depending on the IC process to be characterized. For example, the pattern of polygons 212 and 214 formed on each of the mask areas 202, 204, 206, and 208 of the reticle 200 may be formed to be similar to device structures to be formed by the particular IC process. The same pattern of polygons 212 and 214 formed on each of the mask areas 202, 204, 206, and 208 of the reticle 200 is for forming a desired pattern of the plurality of polygons to be transferred to a semiconductor wafer within a photolithography system.

Figure 5:
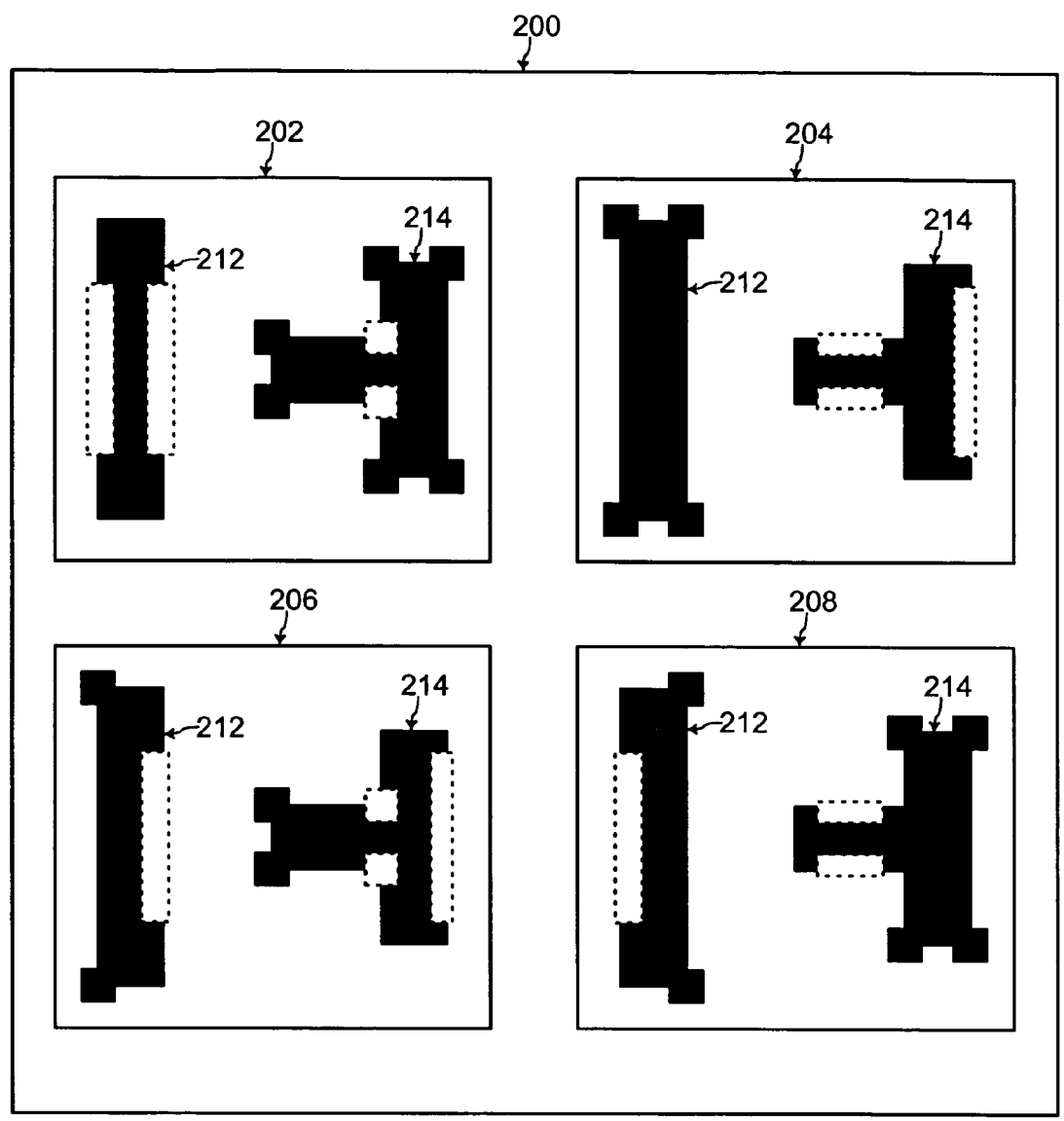
FIG. 5 illustrates the array of mask areas of FIG. 4 with each mask area being modified with respective optical proximity corrections (OPC), according to an embodiment of the present invention.

Referring to FIG. 5, the polygons 212 and 214 are modified within each of the mask areas 202, 204, 206, and 208 of the reticle 200 with respective optical proximity corrections (OPC) perturbations that are different for each of the mask areas 202, 204, 206, and 208 (step 304 of FIG. 7). Such optical proximity corrections (OPC) perturbations for example may include "dog-ears"(i.e., opaque squares or rectangles) added to outside corners of the polygons, "cut-outs" (i.e., transparent squares or rectangles) added to inside corners of the polygons, and long-line embellishments (i.e., transparent rectangles) added to sides of relatively long polygons, as described herein. However, the present invention may be used with any other types of optical proximity corrections (OPC) perturbations, as known to one of ordinary skill in the art of integrated circuit fabrication, added to the polygons of the mask areas 202, 204, 206, and 208. At any rate, referring to FIG. 5, the respective optical proximity corrections (OPC) perturbations added to the same polygons 212 and 214 within each of the mask areas 202, 204, 206, and 208 are different for each of the mask areas 202, 204, 206, and 208.

Figure 1:
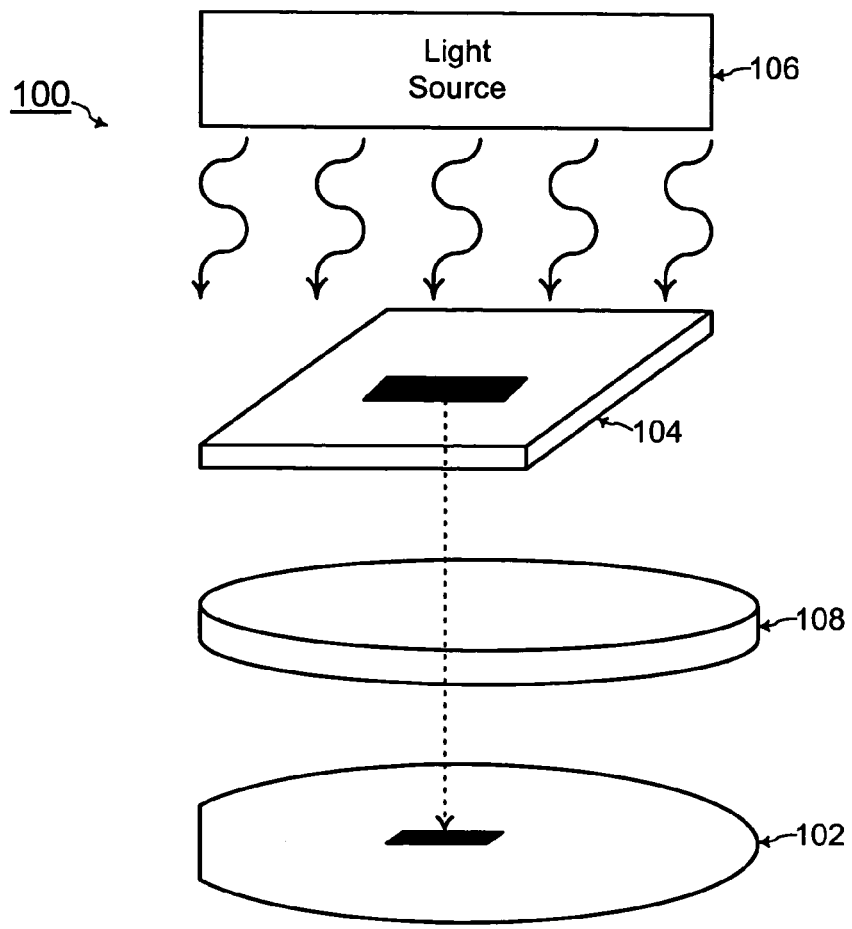
FIG. 1 shows components of a typical photolithography system, according to the prior art.
Figure 2:
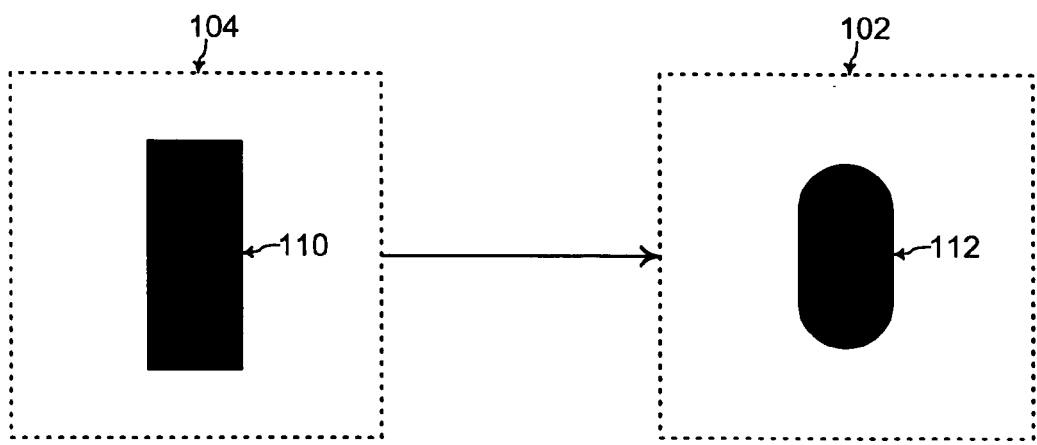
FIG. 2 illustrates non-linear distortions formed for the patterned polygon on the semiconductor wafer when the dimensions of the polygon are smaller than the wavelength of light from the light source of the photolithography system, according to the prior art.
Figure 3:
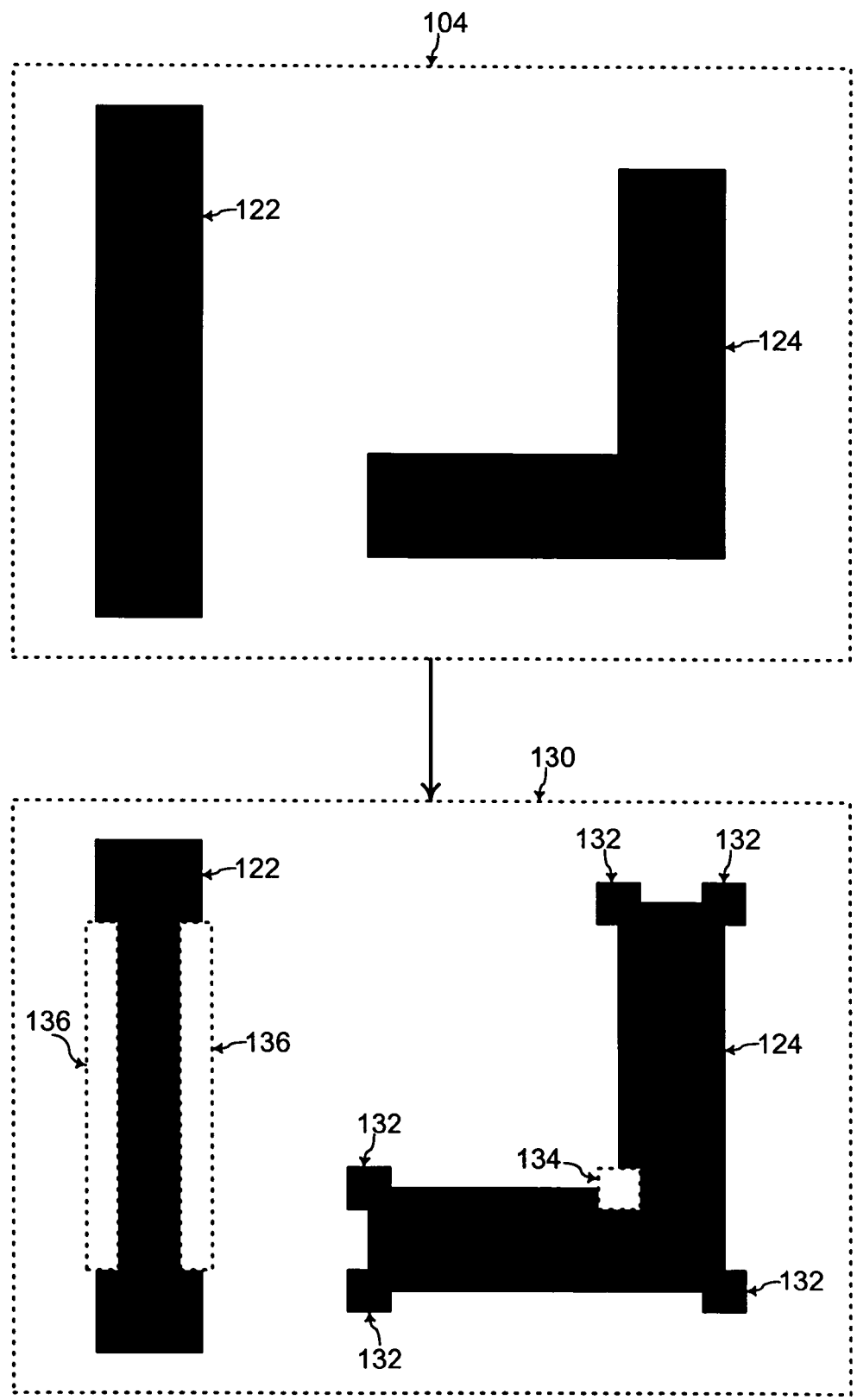
FIG. 3 illustrates example optical proximity corrections (OPC) structures added to polygons on a reticle for negating the non-linear distortions for the patterned polygon on the semiconductor wafer, according to the prior art.
Figure 6:
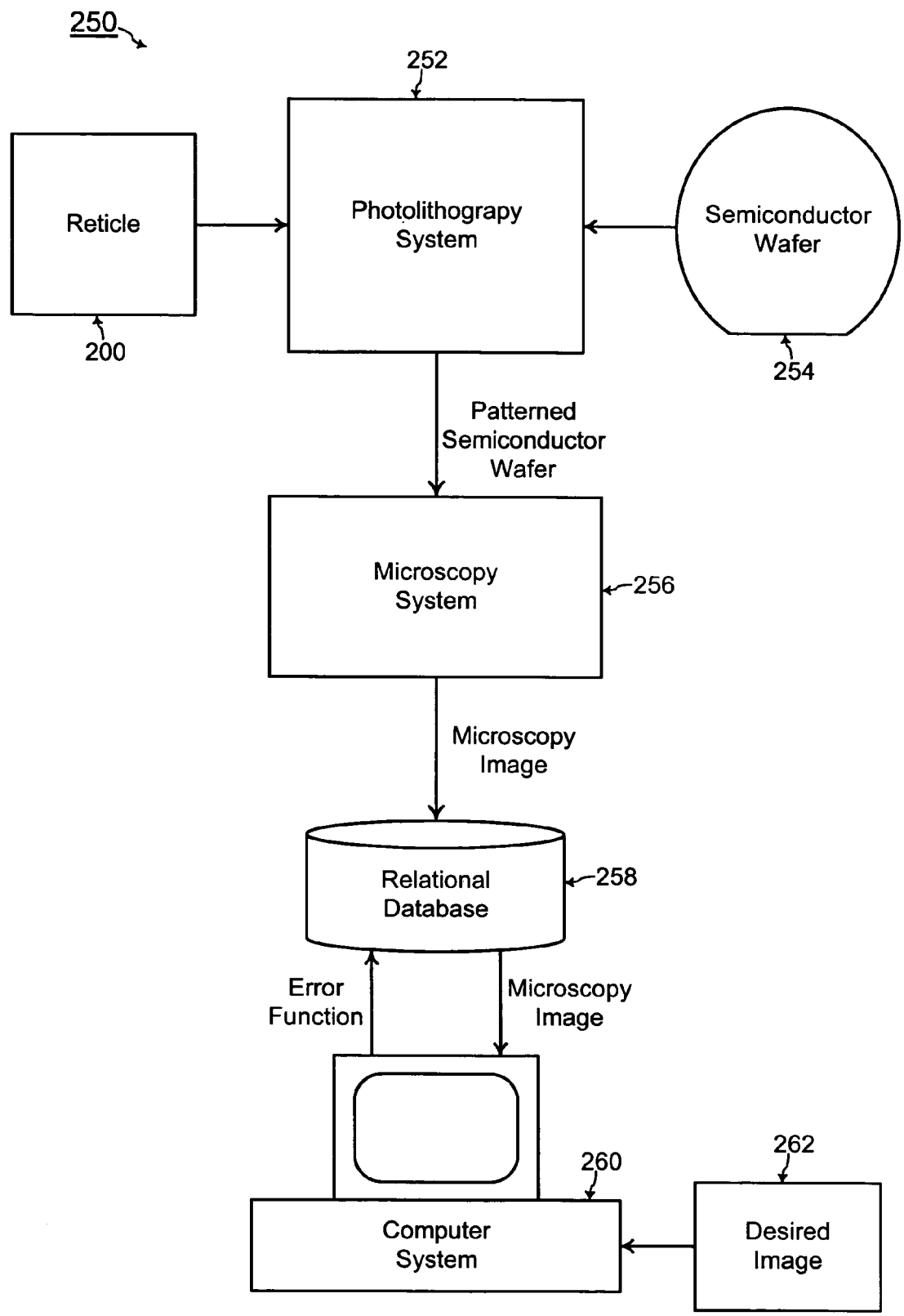
FIG. 6 illustrates components of a system for automatically determining optimum optical proximity corrections (OPC) from the array of mask areas formed on the reticle of FIG. 5, according to an embodiment of the present invention.

Referring to FIG. 6, in a system 250 for determining optimum optical proximity corrections (OPC), the reticle 200 having the mask areas 202, 204, 206, and 208 with the respective optical proximity corrections (OPC) perturbations of FIG. 5 is used within a photolithography system 252 to transfer the pattern of the perturbed polygons of each of the mask areas 202, 204, 206, and 208 onto a semiconductor wafer 254 (step 306 of FIG. 7). Referring to FIGS. 1 and 6, the photolithography system 252 of FIG. 6 is similar to the photolithography system 100 of FIG. 1 with the reticle 200 of FIG. 6 being used for the reticle 104 of FIG. 1 and with the semiconductor wafer 254 of FIG. 6 being used for the semiconductor wafer 102 of FIG. 1.

In this manner, a respective patterned area with respective patterned polygons is fabricated on the semiconductor wafer 254 within the photolithography system 252 from pattern transfer for each of the mask areas 202, 204, 206, and 208. For example, a layer of metal or a layer of polysilicon on the semiconductor wafer 254 may be patterned with the reticle 200 within the photolithography system 252. After pattern transfer to the semiconductor wafer 254 for each of the mask areas 202, 204, 206, and 208 of the reticle 200 within the photolithography system 252, the patterned semiconductor wafer 254 is then transferred to a microscopy system 256.

The microscopy system 256 forms a respective microscopy image of the respective patterned polygons formed within each of the respective patterned areas of the semiconductor wafer corresponding to each of the mask areas 202, 204, 206, and 208 of the reticle 200 (step 308 of FIG. 7). For example, the microscopy system 256 may be a CD (critical dimension) SEM (scanning electron microscopy) system especially amenable for forming such an image of the patterned areas of the semiconductor wafer. Such CD (critical dimension) SEM (scanning electron microscopy) systems are known and commercially available to one of ordinary skill in the art of integrated circuit fabrication.

In addition, the respective microscopy image of the respective patterned area of the semiconductor wafer corresponding to each of the mask areas 202, 204, 206, and 208 of the reticle 200 is stored within a database 258 (step 308 of FIG. 7). The database 258 may be a relational database, an object oriented database, or a flat file database. Technology for such various types of databases is known and commercially available to one of ordinary skill in the art of electronics. The database 258, in one embodiment of the present invention, includes a table of the respective optical proximity corrections (OPC) perturbations applied to each of the mask areas 202, 204, 206, and 208 of the reticle 200 and the respective microscopy image of the respective patterned area of the semiconductor wafer resulting from each of the mask areas 202, 204, 206, and 208.

A computer system 260 then generates a respective error function for each of the mask areas 202, 204, 206, and 208 of the reticle 200 from a desired image 262 of the polygons to be formed on the semiconductor wafer and the respective microscopy image of the respective patterned area of the semiconductor wafer resulting from each of the mask areas 202, 204, 206, and 208 (step 310 of FIG. 7). The respective error function for each of the mask areas 202, 204, 206, and 208 is then stored within the database 258 (step 310 of FIG. 7) such as the table of data within the database 258 for each of the mask areas 202, 204, 206, and 208.

Figure 8:
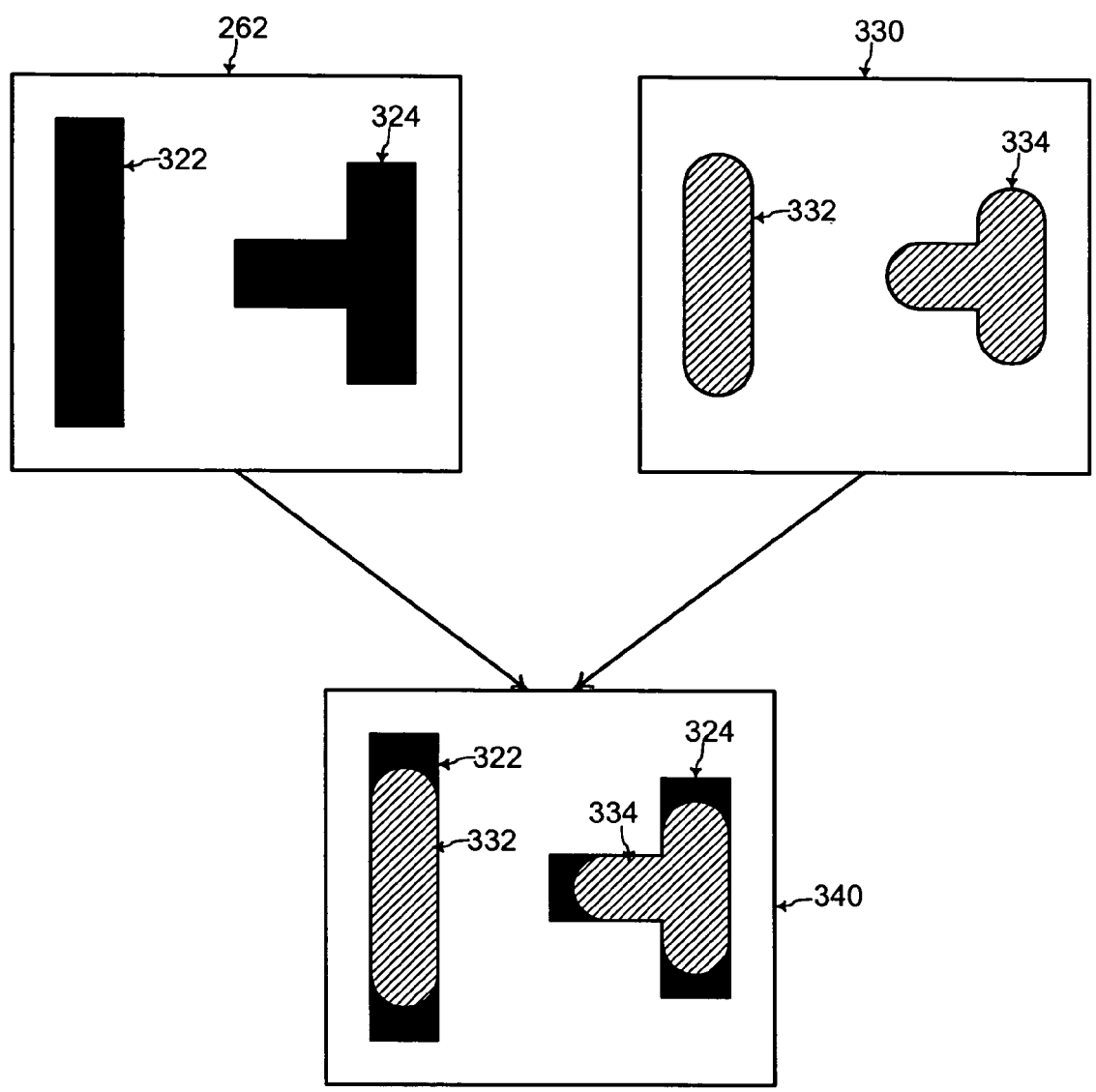
FIG. 8 illustrates overlap of a desired image of patterned polygons on the semiconductor wafer and a microscopy image of patterned polygons on the semiconductor wafer for determining an error function, according to an embodiment of the present invention.

Referring to FIG. 8, the desired image 262 of patterned polygons includes a first desired polygon 322 and a second desired polygon 324. Referring to FIGS. 4 and 8, the first and second desired polygons 322 and 324 of FIG. 8 for example are similar to the first and second polygons 212 and 214 added to each of the mask areas 202, 204, 206, and 208 of the reticle 200 in FIG. 4. Such a desired image 262 is determined and generated to correspond to the mask pattern of polygons formed for each of the mask areas 202, 204, 206, and 208 of the reticle 200 in FIG. 4. Mechanisms for formation of such a desired image 262 is known to one of ordinary skill in the art of integrated circuit fabrication. The desired image 262 is the same for all of the mask areas 202, 204, 206, and 208.

Further referring to FIG. 8, a microscopy image 330 of a patterned area on the semiconductor wafer 254 includes a first patterned polygon 332 corresponding to the first desired polygon 322 and a second patterned polygon 334 corresponding to the second desired polygon 324. The microscopy image 330 of FIG. 8 may be the respective microscopy image of the respective patterned area of the semiconductor wafer resulting from any one of the mask areas 202, 204, 206, and 208 of the reticle 200. Because of non-linear distortions (even with the optical proximity corrections (OPC) perturbations applied to the mask areas 202, 204, 206, and 208) within the photolithography system 252, the first patterned polygon 332 and the second patterned polygon 334 are distorted and different from the first desired polygon 322 and the second desired polygon 324, respectively.

Referring to FIGS. 6 and 8, for generating an error function according to one embodiment of the present invention, the computer system 260 inputs the desired image 262 and the microscopy image 330 and generates an overlapped image 340 with the microscopy image 330 overlapping the desired image 262. In the overlapped image 340, the first patterned polygon 332 of the microscopy image 330 overlaps with the first desired image 322, and the second patterned polygon 334 overlaps with the second desired image 324. However, because the first patterned polygon 332 and the second patterned polygon 334 are distorted and different from the first desired polygon 322 and the second desired polygon 324, the first patterned polygon 332 does not completely overlap with the first desired polygon 322, and the second patterned polygon 334 does not completely overlap with the second desired polygon 324.

Figure 9:
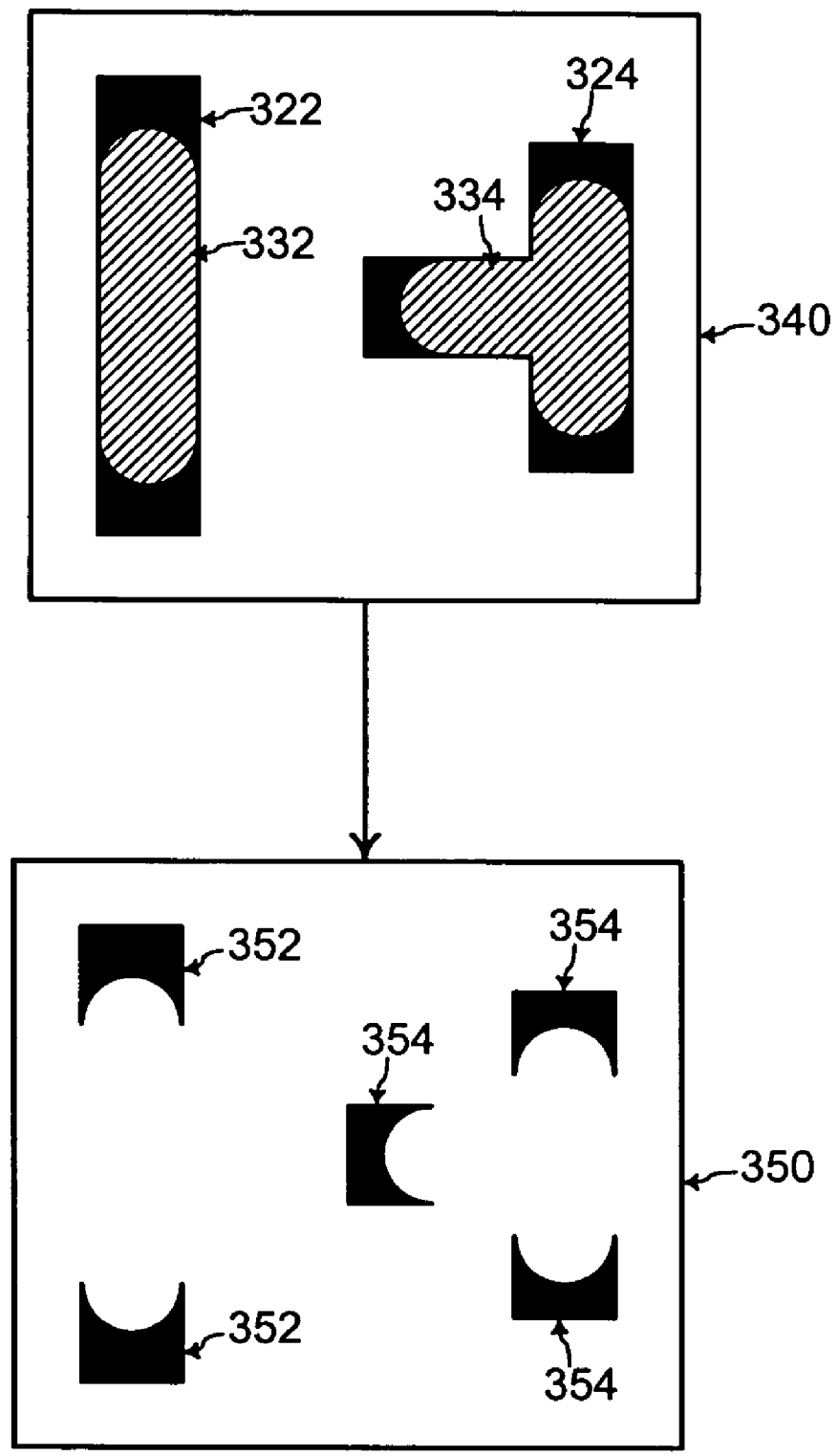
FIG. 9 illustrates generation of an error function from an exclusive OR function of the desired image of patterned polygons on the semiconductor wafer and the microscopy image of patterned polygons on the semiconductor wafer, according to an embodiment of the present invention.

Referring to FIG. 9, for generating the respective error function associated with the microscopy image 340, an error function image 350 is generated to include any area of non-overlap 352 between the first desired polygon 322 and the first patterned polygon 332 and any area of non-overlap 354 between the second patterned polygon 334 and the second desired polygon 324. Such an error function image 350 may be generated by the absolute of the difference between the desired image 262 and the microscopy image 330 (i.e., an exclusive OR function of the desired image 262 and the microscopy image 330). Software applications on the computer system 260 for performing such functions on the desired image 262 and the microscopy image 330 for generating the error function image 350, are known and commercially available to one of ordinary skill in the art of electronics.

Furthermore, for determining the respective error function associated with the microscopy image 340, the areas 352 and 354 of non-overlap of the error function image 350 may be integrated to generate a numerical value for the respective error function associated with the microscopy image 340. Software applications for performing such an integration function on the areas 352 and 354 of non-overlap from the error function image 350 are known and commercially available to one of ordinary skill in the art of electronics. Thus, a numerical value of the respective error function is generated and stored within the database 258 by the computer system 260 to be associated with each of the mask areas 202, 204, 206, and 208 of the reticle 200.

After determining such a numerical value for the respective error function for each of the mask areas 202, 204, 206, and 208 of the reticle 200, the computer system 260 determines the optimum optical proximity corrections (OPC) as the respective optical proximity corrections (OPC) perturbations corresponding to one of the mask areas 202, 204, 206, and 208 of the reticle 200 having a respective numerical value of the error function that is a minimum among all of the mask areas 202, 204, 206, and 208 (step 312 of FIG. 7). Such a minimum numerical value for the respective error function indicates that such optimum optical proximity corrections (OPC) perturbations resulted in the respective microscopy image of patterned of polygons on the semiconductor wafer that is closest to the desired image, and the flow-chart of FIG. 7 ends.

In addition, after determination of the optimum optical proximity corrections (OPC), with a first reticle of a first array of mask areas 202, 204, 206, and 208, the steps of FIG. 7 may be repeated with a second reticle of a second array of mask areas for a new iteration toward a newly iterated optimum optical proximity corrections (OPC). For example, the first iteration with the first reticle of the first array of mask areas may generate optimum optical proximity corrections (OPC) that indicate the optimum shapes and locations of the optical proximity corrections (OPC) structures to be added to the polygons on the reticle. Then, a second iteration with a second reticle of a second array of mask areas may be used with different sizes of such optical proximity corrections (OPC) structures as previously determined in the first iteration to further determine the optimum size of such optical proximity corrections (OPC) structures with the second iteration.

In this manner, optimum optical proximity corrections (OPC) are efficiently and accurately determined for a pattern of polygons by the use of the array of mask areas on the reticle and the computer system with the database. Thus, optimum optical proximity corrections (OPC) may efficiently and accurately be characterized for each different IC (integrated circuit) process or each different photolithography system.

Figure 10:
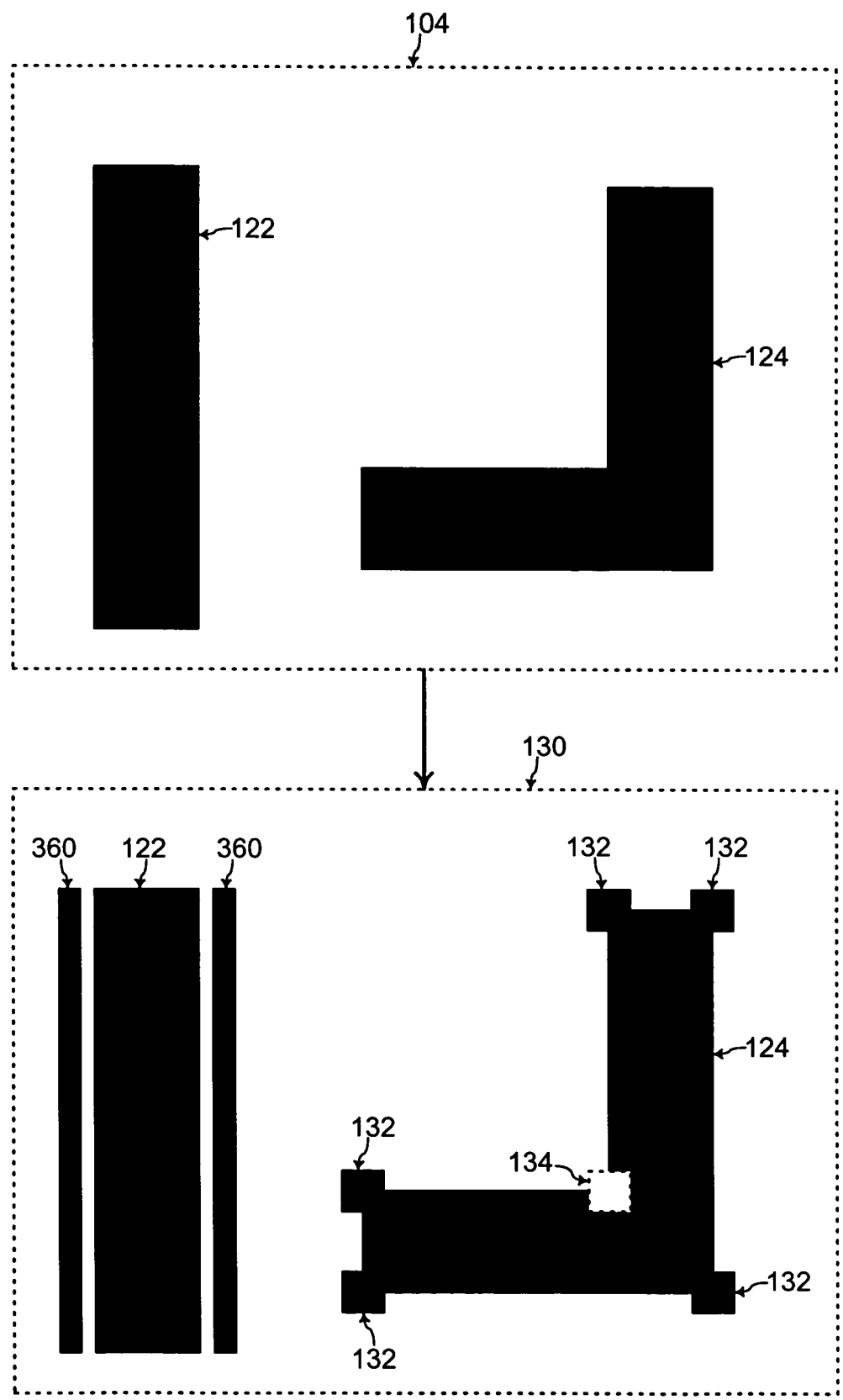
FIG. 10 illustrates example optical proximity corrections (OPC) structures, including scatter bars for example, added to polygons on a reticle for negating the non-linear distortions for the patterned polygon on the semiconductor wafer.

The foregoing is by way of example only and is not intended to be limiting. For example, the present invention is described for the array of four mask areas on the reticle 200. However, the present invention may be practiced with any number of mask areas on the reticle 200. In addition, the present invention may be practiced with any types of optical proximity corrections (OPC). For example, referring to FIG. 10, scatter bars 360 are other types of optical proximity corrections (OPC) structures that may be added along the length of the long-line polygon 122. The present invention is limited only as defined in the following claims and equivalents thereof.

I claim:

1. A system for determining optimum optical proximity corrections (OPCs) for a mask pattern, comprising:
   a reticle having a plurality of mask areas formed thereon with each mask area having the same mask pattern of polygons that are modified with different respective OPCs perturbations;
   a photolithography system for fabricating a respective patterned area on a semiconductor wafer from each mask area of the reticle; and
   a microscopy system for generating a respective microscopy image of each respective patterned area to determine a respective error function for each mask area.

2. The system of claim 1, further comprising:
   a computer system for determining the respective error function for each mask area by comparing a desired image of the mask pattern and the respective microscopy image, and for determining the optimum OPCs as the respective OPCs perturbations corresponding to one of the mask areas having the respective error function that is a minimum of the mask areas.

3. The system of claim 2, wherein the respective error function is determined as an exclusive OR of the desired image with the respective microscopy image for each mask area.

4. The system of claim 2, further comprising:
   another reticle of mask areas having a new iteration of respective OPCs perturbations to the mask pattern for determining newly iterated optimum OPCs depending on previously generated optimum OPCs.

5. The system of claim 1, wherein the respective microscopy image is a SEM (scanning electron microscopy) image.

6. The system of claim 1, further comprising:
   a database for storing the respective microscopy image and the respective error function.

7. The system of claim 1, wherein the respective OPCs perturbations for the mask areas include different feature shapes added to the polygons.

8. The system of claim 7, wherein the feature shapes include dog-ears placed on outside corners of the polygons, cut-outs placed on inside corners of the polygons, long-line embellishments added to the polygons, or scatter bars added to the polygons.

9. The system of claim 7, wherein the respective OPCs perturbations for the mask areas include different sizes of the feature shapes added to the polygons.

10. The system of claim 7, wherein the respective OPCs perturbations for the mask areas include different locations of the feature shapes added to the polygons.

11. The system of claim 1, wherein the polygons of the mask pattern are determined depending on an integrated circuit process.

12. The system of claim 1, wherein different optimum OPCs are determined for different photolithography systems.

* * * * *